(12) United States Patent
Niwa

(10) Patent No.: US 7,999,347 B2
(45) Date of Patent: Aug. 16, 2011

(54) SEMICONDUCTOR DEVICE

(75) Inventor: Fumikazu Niwa, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 181 days.

(21) Appl. No.: 12/471,157

(22) Filed: May 22, 2009

(65) Prior Publication Data

US 2009/0294891 A1    Dec. 3, 2009

(30) Foreign Application Priority Data

May 27, 2008 (JP) ................................. 2008-138424

(51) Int. Cl.
*H01L 29/06* (2006.01)
(52) U.S. Cl. ........................................ 257/494; 257/496
(58) Field of Classification Search .................. 257/494, 257/495, 496, 484
See application file for complete search history.

(56) References Cited

U.S. PATENT DOCUMENTS

| 3,742,317 A | 6/1973 | Shao |
| 4,862,229 A * | 8/1989 | Mundy et al. ................. 257/484 |

FOREIGN PATENT DOCUMENTS

| DE | 196 53 457 C2 | 3/1999 |
| EP | 0 182 088 A1 | 5/1986 |
| JP | 05-275719 A | 10/1993 |
| JP | 06-029557 A | 2/1994 |
| JP | 09-232597 A | 9/1997 |
| JP | 2000-114550 A | 4/2000 |
| JP | 2000-312013 A | 11/2000 |
| JP | 2000-340806 A | 12/2000 |
| JP | 2002-270857 A | 9/2002 |
| JP | 2002-368231 A | 12/2002 |
| JP | 2003-249663 A | 9/2003 |
| JP | 2007-042836 A | 2/2007 |

OTHER PUBLICATIONS

Office Action issued May 17, 2011 in JP 2008-138424 & partial English translation thereof.

* cited by examiner

*Primary Examiner* — Mark Prenty
(74) *Attorney, Agent, or Firm* — Kenyon & Kenyon LLP

(57) ABSTRACT

A semiconductor layer of a vertical diode is divided into a center region and a surrounding region. An anode electrode contacts a surface of the center region in the semiconductor layer. An insulation layer contacts a surface of the surrounding region in the semiconductor layer. Ring-shaped FLR regions are formed in the surface of the surrounding region in the semiconductor layer. The innermost FLR region extends from an inside to an outside of a boundary between the anode electrode and the insulation layer, and extends along the boundary. A shoulder portion is formed in the surface of the semiconductor layer in a manner such that a portion that contacts the insulation layer is higher than a portion that contacts the anode electrode. Flows of holes directed toward the anode electrode pass through a plurality of positions in the shoulder portion.

5 Claims, 5 Drawing Sheets

SEMICONDUCTOR DEVICE

INCORPORATION BY REFERENCE

The disclosure of Japanese Patent Application No. 2008-138424 filed on May 27, 2008, including the specification, drawings and abstract is incorporated herein by reference in its entirety.

BACKGROUND OF THE INVENTION

1. Field of the Invention

The invention relates to a semiconductor device.

2. Description of the Related Art

A vertical semiconductor device, in which a semiconductor layer is divided into a center region and a surrounding region that surrounds the center region, and which has high voltage resistance, has been developed. A semiconductor element structure is formed in the center region. At least one field limited ring (FLR) region is formed in the surface of the semiconductor layer to surround the semiconductor element structure. The FLR region contains an impurity of a conductivity type different from that of the semiconductor layer. Because the FLR region is formed, it is possible to further expand a depletion layer, which spreads over the center region in the semiconductor layer, to the surrounding region when the semiconductor element structure is turned off. It is possible to ensure the high voltage resistance by further expanding the depletion layer formed when the semiconductor element structure is turned off.

FIG. 6 shows a vertical diode 500 with high voltage resistance according to related art. FIG. 6 shows a cross-sectional view of the diode 500. As shown in FIG. 6, the diode 500 includes a semiconductor layer 110. The semiconductor layer 110 is divided into a center region 120 and a surrounding region 118 that surrounds the center region 120. An anode electrode 114 contacts a surface of the center region 120 in the semiconductor layer 110. Further, an insulation layer 112 contacts the surface of the surrounding region 118 in the semiconductor layer 110. A cathode electrode 116 contacts a reverse surface of the semiconductor layer 110. A $p^+$ type anode region 106 is formed in the surface of the center region 120 in the semiconductor layer 110. Ring-shaped $p^+$ type FLR regions 108a, 108b, and 108c are formed in the surface of the surrounding region 118 in the semiconductor layer 110. In other words, the diode 500 includes the plurality of ring-shaped $p^+$ type FLR regions. One of the FLR regions, which is located at an innermost position (hereinafter referred to as an "innermost FLR region 108a"), extends from an inside to an outside of a boundary 119 between the anode electrode 114 and the insulation layer 112, and extends along the boundary 119. Therefore, an outer portion of the surface of the innermost FLR region 108a is covered by the insulation layer 112, and an inner portion of the surface of the innermost FLR region 108a is exposed from the insulation layer 112. It should be noted that, in the specification, the terms "outer" and "outside" indicate the side far from a center portion of the semiconductor device, and the terms "inner" and "inside" indicate the side close to the center portion of the semiconductor device. Further, a portion of the semiconductor layer, which is located inside the boundary between the surface electrode and the insulation layer on the surface of the semiconductor layer, will be referred to as "center region", and a portion of the semiconductor layer, which is located outside the boundary, will be referred to as "surrounding region". The surface electrode contacts the surface of the center region in the semiconductor layer, and the insulation layer contacts the surface of the surrounding region in the semiconductor layer. Between the anode region 106 and a cathode region 102, a drift region 104 exists, as shown in FIG. 6, for example.

FIG. 7 shows an enlarged cross-sectional view of the innermost FLR region 108a formed in the semiconductor layer 110, and an area around the innermost FLR region 108a. In FIG. 7, arrows 115 indicate directions in which reverse recovery currents flow in the diode 500.

When the diode 500 is turned on, holes are injected from the anode region 106 into the drift region 104 in the diode 500. When the diode 500 is switched from on to off (hereinafter, this process will be referred to as "turn off"), a depletion layer expands in the center region 120 in the semiconductor layer 110. The expansion of the depletion layer pushes some of holes in the center region 120 in the semiconductor layer 110 toward the surrounding region 118 in the semiconductor layer 110. The holes moved to the surrounding region 118 are discharged from the surrounding region 118 to the anode electrode 114 through the innermost FLR region 108a. Because the holes flow in the above-described manner, the reverse recovery currents are generated. The reverse recovery current tends to flow through a path with the lowest resistance (that is, the shortest path from the surrounding region 118 to the anode electrode 114). Therefore, as shown in FIG. 7, the reverse recovery currents are concentrated at a position 108e immediately below the boundary 119 between the anode electrode 114 and the insulation layer 112. If the reverse recovery currents are concentrated in the above-described manner, a portion at which the reverse recovery currents are concentrated may be heated, possibly resulting in breaking of the diode 500.

Japanese Patent Application Publication No. 9-232597 (JP-A-9-232597) describes a diode in which the concentration of the reverse recovery currents is reduced. In the diode, the anode region is formed in the surface of the center region in the semiconductor layer. Further, the insulation layer is formed on the surface of the semiconductor layer in a manner such that the insulation layer extends from the surrounding region to reach an outer portion of a surface of the anode region. An inner portion of the surface of the anode region contacts the anode electrode. According to this technology, it is possible to reduce the density of the reverse recovery currents. As a result, it is possible to reduce the concentration of the reverse recovery currents.

According to the technology described in the publication No. 9-232597, it is possible to reduce the concentration of the reverse recovery currents to some extent. However, the concentration of the reverse recovery currents is not sufficiently reduced, and there is still a possibility that the semiconductor device is broken.

SUMMARY OF THE INVENTION

The invention provides a semiconductor device in which concentration of reverse recovery currents is further reduced.

An aspect of the invention relates to a semiconductor device that includes: a semiconductor layer of a first conductivity type; a first main electrode that contacts a surface of a center region in the semiconductor layer; a second main electrode that contacts a reverse surface of the semiconductor layer; and an insulation layer that contacts a surface of a surrounding region in the semiconductor layer, the surrounding region surrounding the center region. In this specification, a portion of the semiconductor layer, whose surface contacts the first main electrode, is referred to as the center region, and a portion of the semiconductor layer, whose surface contacts the insulation layer, is referred to as the surrounding region.

The first main electrode may extend to reach a side surface of the insulation layer, or may further extend outward along a surface of the insulation layer beyond the side surface of the insulation layer.

The semiconductor device according to the aspect further includes a ring-shaped region of a second conductivity type, which is formed in the surface of the semiconductor layer in a manner such that the ring-shaped region extends from an inside to an outside of a boundary between the first main electrode and the insulation layer, and extends along the boundary. For example, in the case of a PN-junction diode, an anode region of a second conductivity type may be formed inside the ring-shaped region at a position away from the ring-shaped region. Alternatively, the anode region may contact the ring-shaped region. Further, in the case of the PN-junction diode, the anode region of the second conductivity type may include a ring-shaped portion located at an outer periphery of the anode region, and the ring-shaped portion may function as the ring-shaped region. Further, the ring-shaped region may continuously extend, or may discontinuously extend. Still further, a separate ring-shaped semiconductor region may be formed outside the ring-shaped region.

Further, in the semiconductor device according to the aforementioned aspect, a shoulder portion is formed in the ring-shaped region in a manner such that a portion of the shoulder portion that contacts the insulation layer is higher than a portion of the shoulder portion that contacts the first main electrode. It should be noted that the height and configuration of the shoulder portion are not specifically limited.

In the aforementioned semiconductor device, holes moved to the surrounding region are discharged to the first main electrode through the ring-shaped region when the semiconductor device is turned off. Holes moved to the surrounding region tend to move to the first main electrode through the shortest path. Because the shoulder portion is formed in the surface of the semiconductor layer, reverse recovery currents pass through a plurality of positions in the shoulder portion. This makes it possible to reduce concentration of the reverse recovery currents at an outermost position in the entire area in which the ring-shaped region contacts the first main electrode. In the semiconductor device according to the invention, it is possible to effectively reduce the concentration of reverse recovery currents when the semiconductor device is turned off.

According to the invention, it is possible to provide the semiconductor device in which the concentration of the reverse recovery currents is effectively reduced when the semiconductor device is turned off.

BRIEF DESCRIPTION OF THE DRAWINGS

The features, advantages, and technical and industrial significance of this invention will be described in the following detailed description of embodiments of the invention with reference to the accompanying drawings, in which like numerals denote like elements, and wherein.

DETAILED DESCRIPTION OF EMBODIMENTS

A diode according to embodiments of the invention includes a plurality of $p^+$ type field limited ring (FLR) regions in a surface of a semiconductor layer.

Figure 1:
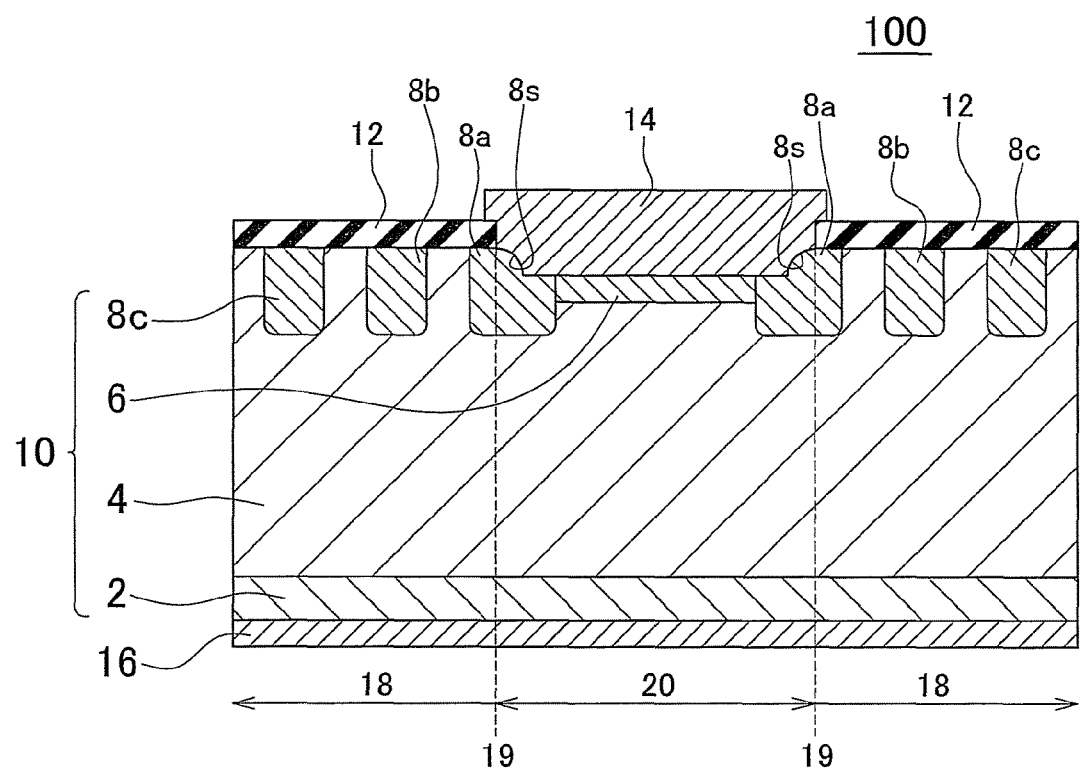
FIG. 1 shows a cross-sectional view of a diode according to a first embodiment of the invention.

FIG. 1 shows a cross-sectional view of a vertical diode (semiconductor device) 100 according to a first embodiment of the invention. As shown in FIG. 1, the diode 100 includes a semiconductor layer 10. The semiconductor layer 10 of the diode 100 is divided into a center region 20 and a surrounding region 18 that is provided to surround the center region 20. An anode electrode (first main electrode) 14 contacts a surface of the center region 20 in the semiconductor layer 10. An insulation layer 12 contacts a surface of the surrounding region 18 in the semiconductor layer 10. A cathode electrode (second main electrode) 16 contacts a reverse surface of the semiconductor layer 10. A $p^+$ type anode region 6 is formed in the surface of the center region 20 in the semiconductor layer 10. Further, a plurality of ring-shaped $p^+$ type FLR regions 8a, 8b, and 8c are concentrically formed in the surface of the surrounding region 18 in the semiconductor layer 10. Because the FLR regions 8a, 8b, and 8c are formed in the diode 100, it is possible to widely expand a depletion layer from the center region 20 toward the surrounding region 18 when the diode 100 is turned off. Between the anode region 6 and a cathode region 2, a drift region 4 exists, as shown in FIG. 1, for example.

One of the FLR regions (ring-shaped regions) 8, which is located at an innermost position (hereinafter referred to as an "innermost FLR region 8a"), extends from an inside to an outside of a boundary 19 between the anode electrode 14 and the insulation layer 12, and extends along the boundary 19. Therefore, an outer portion of the surface of the innermost FLR region 8a is covered by the insulation layer 12, and an inner portion of the surface of the innermost FLR region 8a is exposed from the insulation layer 12. The insulation layer 12 extends outward from the surface of the innermost FLR region 8a so as to cover the entire surfaces of the FLR regions 8b and 8c and reaches an outer edge of the semiconductor layer 10. The anode electrode 14 extends outward to reach an inner side surface of the insulation layer 12, and further extends outward along the surface of the insulation layer 12. A shoulder portion 8s is formed in the innermost FLR region 8a formed in the surface of the semiconductor layer 10 in a manner such that a portion of the shoulder portion 8s that contacts the insulation layer 12 is higher than a portion of the shoulder portion 8s that contacts the anode electrode 14.

Figure 2:
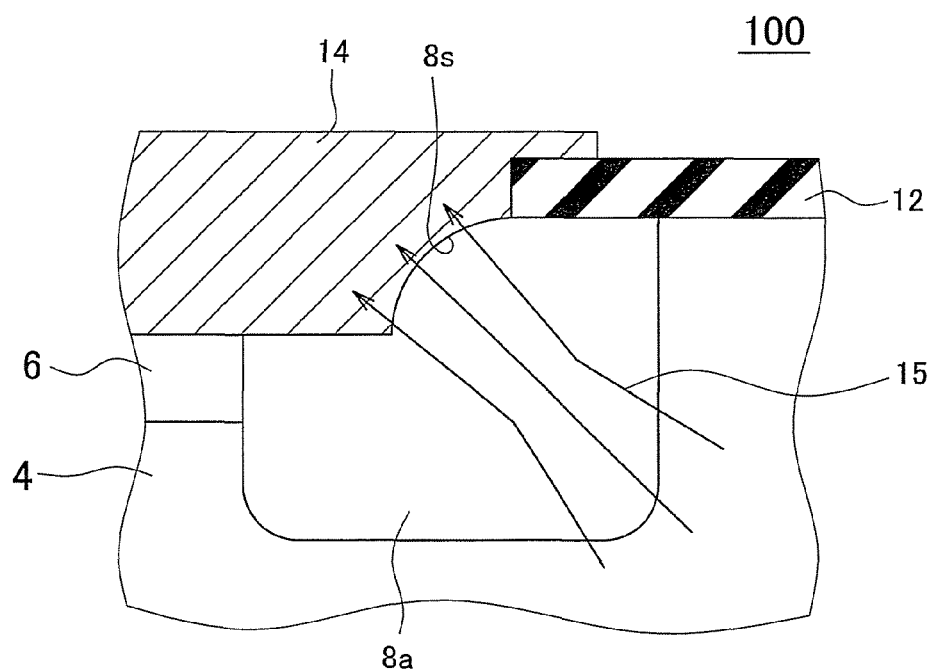
FIG. 2 shows an enlarged cross-sectional view of an innermost FLR region of the diode shown in FIG. 1, and an area around the innermost FLR region.

FIG. 2 shows an enlarged cross-sectional view of the innermost FLR region 8a formed in the semiconductor layer 10, and an area around the innermost FLR region 8a. In FIG. 2, arrows 15 indicate directions in which reverse recovery currents flow in the diode 100.

In the diode 100, holes moved to the surrounding region 18 are discharged to the anode electrode 14 through the innermost FLR region 8a when the diode 100 is turned off. Because the shoulder portion 8s is formed in the surface of the semiconductor layer 10, reverse recovery currents pass through a plurality of positions in a boundary surface between the anode electrode 14 and the innermost FLR region 8a in which the shoulder portion 8s is formed. Further, as shown in FIG. 2, because the shoulder portion 8s is convex toward the surface of the semiconductor layer 10, the flows of the holes spread when the holes flow toward the anode electrode 14. In the diode 100, it is possible to effectively reduce concentration of the reverse recovery currents at a specific portion when the diode 100 is turned off.

Figure 3:
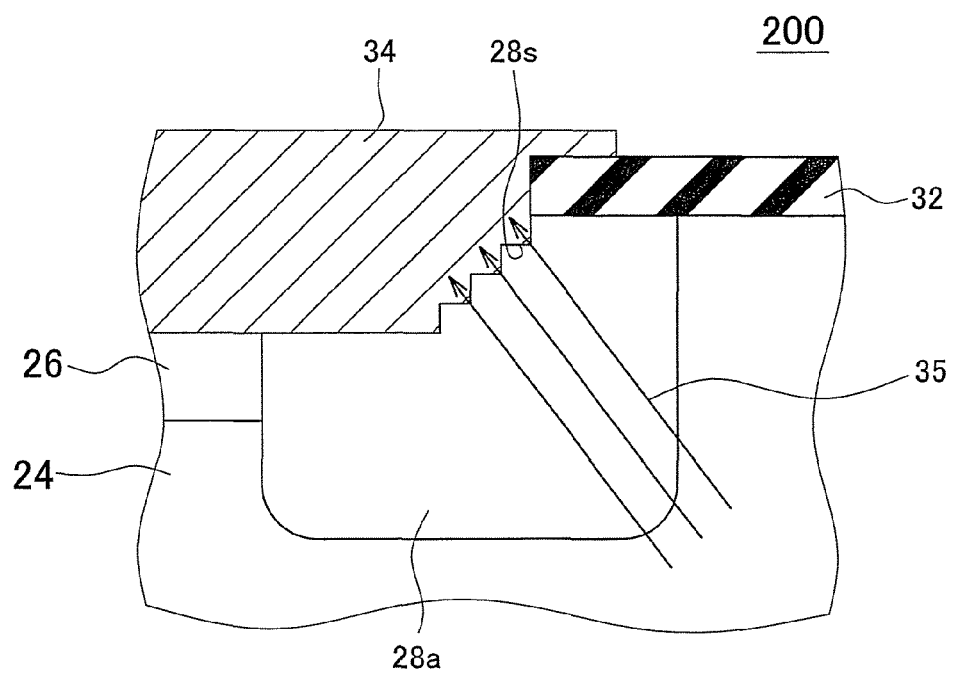
FIG. 3 shows an enlarged cross-sectional view of an innermost FLR region of a diode according to a second embodiment of the invention, and an area around the innermost FLR region.

FIG. 3 shows a cross-sectional view of a diode 200 according to a second embodiment of the invention. FIG. 3 shows an enlarged cross-sectional view of an innermost FLR region 28a formed in the semiconductor layer of the diode 200, and an area around the innermost FLR region 28a. The configuration of the diode 200 is different from the configuration of the diode 100 only in the configuration of a shoulder portion 28s, and therefore, the description of a drift region 24, an anode region 26, the innermost FLR region 28a, an insulation layer 32, and an anode electrode 34 will be omitted in the description of the second embodiment.

Arrows 35 in FIG. 3 indicate directions in which the reverse recovery currents flow in the diode 200. As shown in FIG. 3, in the diode 200, the shoulder portion 28s includes a plurality of consecutive steps. In this configuration, the holes flow toward the plurality of steps of the shoulder portion 28s, that is, the holes pass through a plurality of positions in the boundary surface between the anode electrode 34 and the innermost FLR region 28a in which the shoulder portion 28s is formed. In the diode 200, because the reverse recovery currents pass through the plurality of positions as described above, it is possible to reduce the concentration of the reverse recovery currents at a specific portion when the diode 200 is turned off.

Using a known process, it is possible to easily form the shoulder portion 8s in the surface of the semiconductor layer 10 in the diode 100 according to the first embodiment and the shoulder portion 28s in the surface of the semiconductor layer in the diode 200 according to the second embodiment. Next, an example of a method of forming the shoulder portions 8s and 28s will be described. After the anode region and the FLR regions are formed in the surface of the semiconductor layer, the insulation layer is formed on the surface of the surrounding region in the semiconductor layer using, for example, silicon nitride. Then, the entire surface of the insulation layer thus formed is masked by, for example, a resist film. The unmasked portion of the surface of the semiconductor layer is dry-etched to a small depth so as to form a recessed portion. Next, a side surface of the recessed portion and a narrow outer peripheral portion of a bottom surface of the recessed portion are covered by a new mask. Then, the unmasked portion of the surface of the semiconductor layer is again dry-etched to a small depth so as to form a new recessed portion. The mask is repeatedly formed as described above and the dry etching process is also repeatedly performed as described above. The dry etching process is repeatedly performed as described above according to the desired shape of the shoulder portion 8s in the finished diode 100 or the desired shape of the shoulder portion 28s in the finished diode 200. In this way, the shoulder portion 8s or the shoulder portion 28s is formed in the surface of the semiconductor layer.

Figure 4:
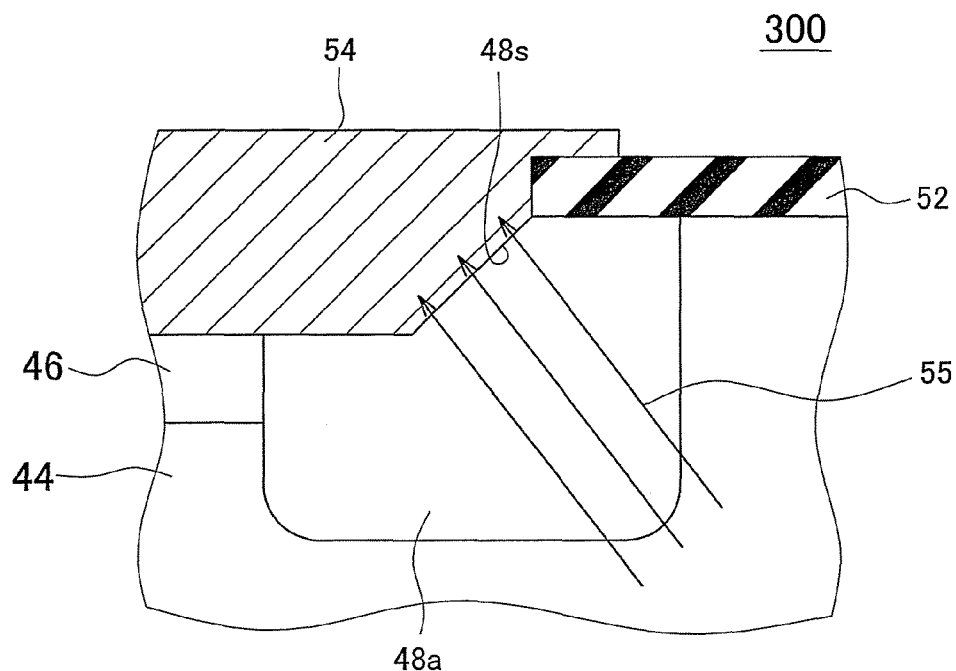
FIG. 4 shows an enlarged cross-sectional view of an innermost FLR region of a diode according to a third embodiment of the invention, and an area around the innermost FLR region.

FIG. 4 shows a cross-sectional view of a diode 300 according to a third embodiment of the invention. FIG. 4 shows an enlarged cross-sectional view of an innermost FLR region 48a formed in the semiconductor layer of the diode 300, and an area around the innermost FLR region 48a. Because the configuration of the diode 300 is different from the configuration of the diode 100 according to the first embodiment only in the configuration of a shoulder portion 48s, the description of a drift region 44, an anode region 46, the innermost FLR region 48a, an insulation layer 52, an anode electrode 54 will be omitted in the description of the third embodiment.

Arrows 55 in FIG. 4 indicate directions in which the reverse recovery currents flow in the diode 300. As shown in FIG. 4, in the diode 300, the shoulder portion 48s is linearly inclined in a manner such that a portion of the shoulder portion 48s that contacts the insulation layer 52 is higher than a portion of the shoulder portion 48s that contacts the anode electrode (first main electrode) 54. When the shoulder portion 48s is thus configured, the flows of holes directed toward the anode electrode 54 pass through a plurality of positions in the boundary surface between the anode electrode 54 and the innermost FLR region 48a in which the shoulder portion 48s is formed. In the diode 300, it is possible to reduce the concentration of the reverse recovery currents at a specific portion when the diode 300 is turned off.

Figure 5:
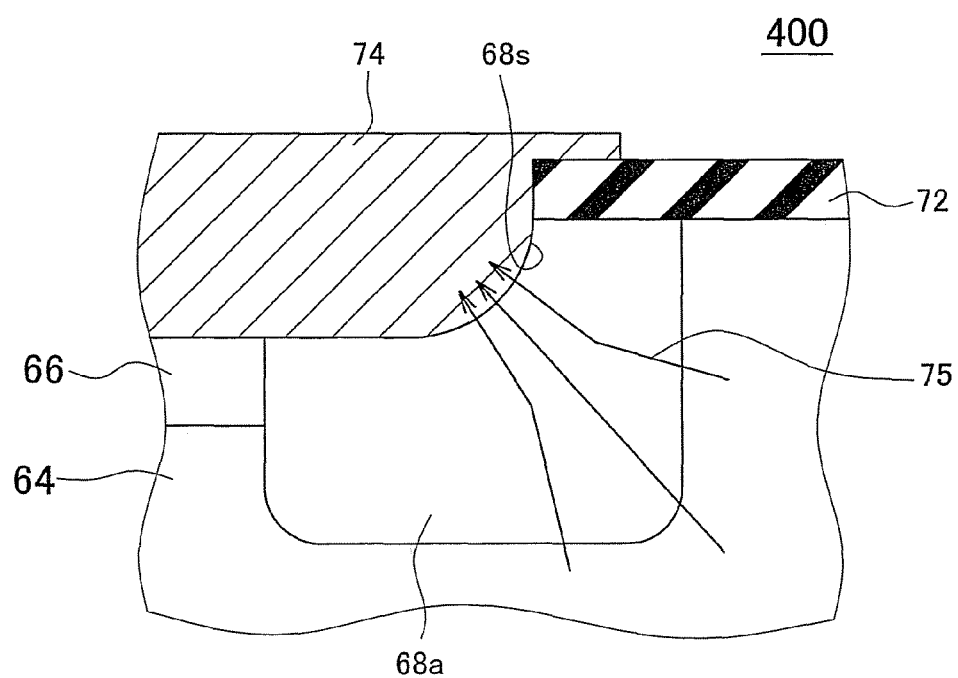
FIG. 5 shows an enlarged cross-sectional view of an innermost FLR region of a diode according to a fourth embodiment of the invention, and an area around the innermost FLR region.
Figure 6:
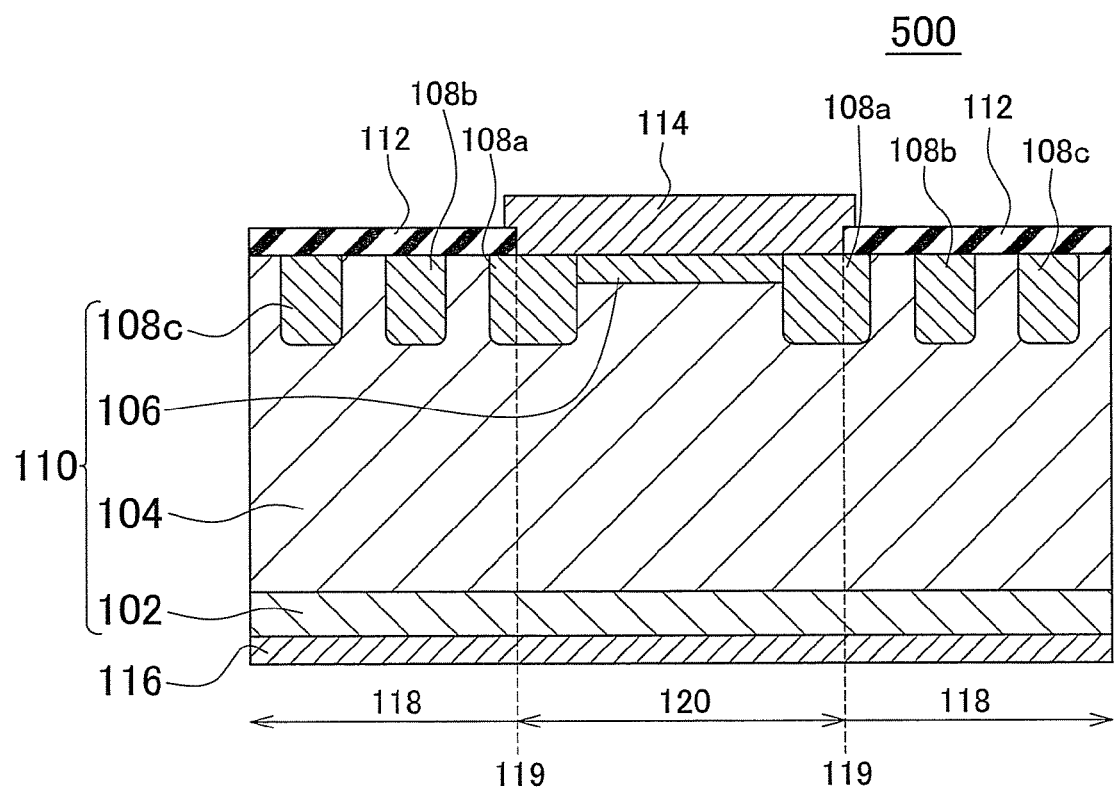
FIG. 6 shows a cross-sectional view of a diode according to related art.
Figure 7:
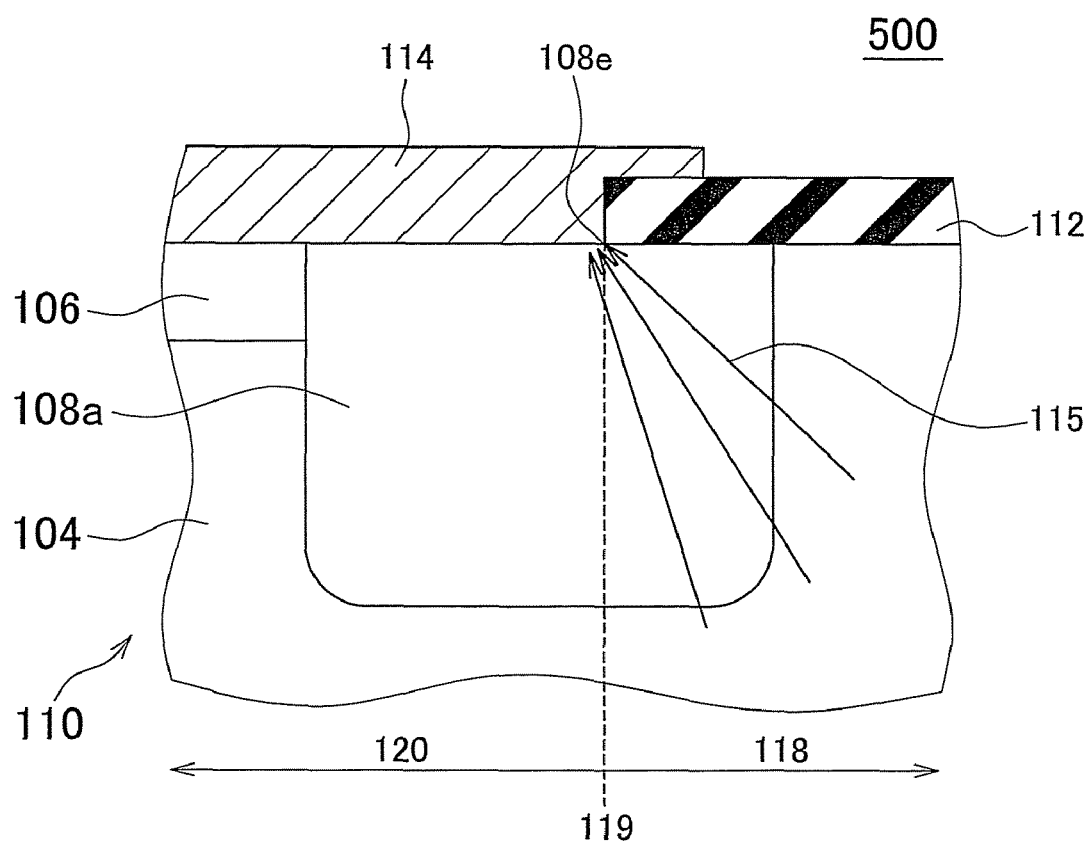
FIG. 7 shows an enlarged cross-sectional view of an innermost FLR region of the diode shown in FIG. 6, and an area around the innermost FLR region.

FIG. 5 shows a cross-sectional view of a diode 400 according to a fourth embodiment of the invention. FIG. 5 shows an enlarged view of an innermost FLR region 68a formed in the semiconductor layer of the diode 400, and an area around the innermost FLR region 68a. The diode 400 is different from the diode 100 according to the first embodiment only in the configuration of a shoulder portion 68s, and therefore, the description of a drift region 64, an anode region 66, the innermost FLR region 68a, an insulation layer 72, and an anode electrode 74 will be omitted in the description of the fourth embodiment.

Arrows 75 shown in FIG. 5 indicate directions in which the reverse recovery currents flow in the diode 400. As shown in FIG. 5, in the diode 400, the shoulder portion 68s is concave toward the reverse surface of the semiconductor layer. When the shoulder portion 68s is thus configured, the flows of holes directed toward an anode electrode 74 pass through a plurality of positions in the boundary surface between the anode electrode 74 and the innermost FLR region 68a in which the shoulder portion 68s is formed. In the diode 400, it is possible to reduce the concentration of the reverse recovery currents at a specific portion when the diode 400 is turned off.

Using a known process, it is possible to easily form the shoulder portion 48s in the surface of the semiconductor layer in the diode 300 according to the third embodiment and the shoulder portion 68s in the surface of the semiconductor layer in the diode 400 according to the fourth embodiment. An example of a method of forming the shoulder portions 48s and 68s will be described below. After the anode region and the FLR regions are formed in the surface of the semiconductor layer, the insulation layer is formed on the surface of the surrounding region in the semiconductor layer using, for example, silicon nitride as the material of the insulation layer. Next, a portion of the surface of the semiconductor layer that is exposed from the insulation layer is oxidized by a process of local oxidation of silicon (LOCOS). Then, an oxide layer formed by the LOCOS process is removed by wet etching. The shoulder portions 48s and 68s are formed in the surface of the semiconductor layer by performing the above-described processes. By adjusting the thickness of the oxide layer formed by the LOCOS process, it is possible to form a linear inclination in the innermost FLR region 48a, which functions as the shoulder portion 48s in the finished diode 300, or form the concave in the innermost FLR region 68a, which functions as the shoulder portion 68s in the finished diode 400.

While the invention has been described with reference to example embodiments thereof, it should be understood that the invention is not limited to the example embodiments or constructions. To the contrary, the invention is intended to cover various modifications and equivalent arrangements. In addition, while the various elements of the example embodiments are shown in various combinations and configurations, which are example, other combinations and configurations, including more, less or only a single element, are also within the spirit and scope of the invention.

What is claimed is:

1. A semiconductor device, comprising:
    a semiconductor layer of a first conductivity type;
    a first main electrode that contacts a surface of a center region in the semiconductor layer;
    a second main electrode that contacts a reverse surface of the semiconductor layer;
    an insulation layer that contacts a surface of a surrounding region in the semiconductor layer, the surrounding region surrounding the center region; and
    a ring-shaped region of a second conductivity type, which is formed in the surface of the semiconductor layer in a manner such that the ring-shaped region extends from an inside to an outside of a boundary between the first main electrode and the insulation layer, and extends along the boundary,
    wherein a shoulder portion is formed in the ring-shaped region in a manner such that a portion of the shoulder portion that contacts the insulation layer is higher than a portion of the shoulder portion that contacts the first main electrode, and
    wherein the shoulder portion is formed in the ring-shaped region in a manner such that the shoulder portion is convex toward the first main electrode in a cross-sectional view of the semiconductor layer taken along an axial direction of the ring-shaped region.

2. A semiconductor device, comprising:
    a semiconductor layer of a first conductivity type;
    a first main electrode that contacts a surface of a center region in the semiconductor layer;
    a second main electrode that contacts a reverse surface of the semiconductor layer;
    an insulation layer that contacts a surface of a surrounding region in the semiconductor layer, the surrounding region surrounding the center region; and
    a ring-shaped region of a second conductivity type, which is formed in the surface of the semiconductor layer in a manner such that the ring-shaped region extends from an inside to an outside of a boundary between the first main electrode and the insulation layer, and extends along the boundary,
    wherein a shoulder portion is formed in the ring-shaped region in a manner such that a portion of the shoulder portion that contacts the insulation layer is higher than a portion of the shoulder portion that contacts the first main electrode, and
    wherein the shoulder portion includes a plurality of consecutive steps.

3. A semiconductor device, comprising:
    a semiconductor layer of a first conductivity type;
    a first main electrode that contacts a surface of a center region in the semiconductor layer;
    a second main electrode that contacts a reverse surface of the semiconductor layer;
    an insulation layer that contacts a surface of a surrounding region in the semiconductor layer, the surrounding region surrounding the center region; and
    a ring-shaped region of a second conductivity type, which is formed in the surface of the semiconductor layer in a manner such that the ring-shaped region extends from an inside to an outside of a boundary between the first main electrode and the insulation layer, and extends along the boundary,
    wherein a shoulder portion is formed in the ring-shaped region in a manner such that a portion of the shoulder portion that contacts the insulation layer is higher than a portion of the shoulder portion that contacts the first main electrode, and
    wherein the shoulder portion is formed in the ring-shaped region in a manner such that the shoulder portion is concave toward the second main electrode in a cross-sectional view of the semiconductor layer taken along an axial direction of the ring-shaped region.

4. A semiconductor device, comprising:
    a semiconductor layer of a first conductivity type;
    a first main electrode that contacts a surface of a center region in the semiconductor layer;
    a second main electrode that contacts a reverse surface of the semiconductor layer;
    an insulation layer that contacts a surface of a surrounding region in the semiconductor layer, the surrounding region surrounding the center region; and
    a ring-shaped region of a second conductivity type, which is formed in the surface of the semiconductor layer in a manner such that the ring-shaped region extends from an inside to an outside of a boundary between the first main electrode and the insulation layer, and extends along the boundary,
    wherein a shoulder portion is formed in the ring-shaped region in a manner such that a portion of the shoulder portion that contacts the insulation layer is higher than a portion of the shoulder portion that contacts the first main electrode, and
    wherein the shoulder portion is linearly inclined in a manner such that a portion of the shoulder portion that contacts the insulation layer is higher than a portion of the shoulder portion that contacts the first main electrode.

5. The semiconductor device according to claim 1, wherein the ring-shaped region is a $p^+$ type field limited ring region.

* * * * *